United States Patent [19]

Henry et al.

[11] Patent Number: 5,564,010

[45] Date of Patent: Oct. 8, 1996

[54] RESET SIGNAL GENERATOR, FOR GENERATING RESETS OF MULTIPLE DURATION

[75] Inventors: Paul D. Henry, Carmel; William J. Testin, Indianapolis, both of Ind.

[73] Assignee: Thomson Consumer Electronics, Inc., Indianapolis, Ind.

[21] Appl. No.: 567,711

[22] Filed: Dec. 5, 1995

Related U.S. Application Data

[63] Continuation of Ser. No. 65,008, May 24, 1993, abandoned.

[51] Int. Cl.$^6$ .................................................. G06F 11/00
[52] U.S. Cl. ............................ 395/182.2; 395/182.21; 364/273.4; 364/948.9
[58] Field of Search .................... 395/182.2, 182.21, 395/750; 364/273.4, 948.9, 948.4

[56] References Cited

U.S. PATENT DOCUMENTS

| | | | |
|---|---|---|---|
| 3,950,654 | 4/1976 | Broedner et al. | 307/208 |
| 4,461,963 | 7/1984 | Koomen | 307/279 |
| 4,523,295 | 6/1985 | Zato | 364/900 |
| 4,531,214 | 7/1985 | Torres et al. | 371/66 |
| 4,591,745 | 5/1985 | Shen | 307/592 |
| 4,633,107 | 12/1986 | Norsworthy | 307/594 |
| 4,656,399 | 4/1987 | Testin et al. | 315/411 |
| 4,716,323 | 12/1987 | Wada et al. | 307/594 |
| 5,036,261 | 6/1991 | Testin | 315/411 |
| 5,115,146 | 5/1992 | McClure | 307/272.3 |
| 5,157,270 | 10/1992 | Sakai | 307/66 |
| 5,159,217 | 10/1992 | Mortensen et al. | 307/597 |
| 5,285,452 | 2/1994 | Wee et al. | 371/12 |
| 5,302,861 | 4/1994 | Jelinek | 307/296.5 |

FOREIGN PATENT DOCUMENTS 0182971  10/1984  European Pat. Off. ....... G01R 19/165

OTHER PUBLICATIONS

John D. Lenk, McGraw–Hill Circuit Encyclopedia and Troubleshooting Guide, vol. 1, p. 314.

Protopapas, Microcomputer Hardware Design, Prentice--Hall, 1988, at 34–35, 65–66.

U.S. Patent application Ser. No. 854,396 (RCA 86330) filed Mar. 19, 1992 by Wee et al., Microcomputer Power Failure Control Circuit.

Article, Electronics Designer's Casebook, vol. 14D, pp. 72–73, by Seino, Power–Failure Detector is Good for Short Lapses.

Article, Electronic Design, Feb. 19, 1981, pp. 192–196, by Burzynski, Automatic Reset Products μ–Based Systems from Undervoltage, Memory Hangup.

*Primary Examiner*—Robert W. Beausoliel, Jr.
*Assistant Examiner*—Norman M. Wright
*Attorney, Agent, or Firm*—Joseph S. Tripoli; Peter M. Emanuel; Thomas F. Lenihan

[57] ABSTRACT

A reset signal generator includes circuitry for detecting conditions indicating that a reset signal is necessary and generating a reset signal in response. Such conditions may include low power supply voltage (i.e., "brown out") or the presence of transient signal spikes. Circuitry is provided for extending the duration of the reset signal after power is initially applied, because at this time associated digital circuitry may not be fully powered-up, and may require a longer than normal reset pulse. In contrast, a reset pulse of a normal duration is generated when the digital circuitry is fully powered-up and a transient signal spike is detected. Isolating circuitry is coupled between the detecting circuit and the extending circuit to isolate the detecting circuit from the extending circuit when there is no power-on condition, (i.e. when normal operating voltage is present) in order to prevent the duration of the reset pulse from being extended.

15 Claims, 3 Drawing Sheets

5,564,010

RESET SIGNAL GENERATOR, FOR GENERATING RESETS OF MULTIPLE DURATION

This is a continuation of application Ser. No. 08/065,008, filed May 24, 1993, now abandoned.

FIELD OF THE INVENTION

The present application relates to apparatus for providing a reset signal for digital circuitry incorporated in electronic apparatus.

BACKGROUND OF THE INVENTION

Digital circuitry incorporated into electronic apparatus sometimes enters an in an indeterminate state. For example, when power is applied to the circuitry, either at start-up time, or after a power outage, the power-on state of the digital circuitry is unknown. Also, during a power brown out, the lowered supply voltages may cause digital circuitry to enter an unknown state. In addition, during operation of the apparatus containing the digital circuitry, transient signals (which are short duration, high frequency signals, possibly with high voltage), induced either on power supply lines, signal lines or within the digital circuitry itself, may cause the digital circuitry to enter an unknown state. In such situations, it is necessary to provide a reset signal which forces the digital circuitry into a predetermined state, from which proper operation may be resumed.

In a power-on condition, the power supply voltages are just ramping up, and the digital circuitry is not yet operating. Under these conditions, some digital circuitry requires a reset signal having a longer duration than would be necessary under normal operating conditions. However, in the other two situations, (during a brown out and after a transient signal), the digital circuitry is operating, and the voltages are stable. In such situations, a reset signal having a normal duration is sufficient. Thus, the conditions under which reset signals are required are different, and the parameters of the required reset signals are correspondingly different.

In particular, detection of transients is difficult because of their high frequency content. Any capacitive reactance coupled to ground in the reset circuitry will tend to dissipate the high frequencies, and may cause a transient to go undetected. Thus, to detect transients, capacitance must be minimized in the detector circuit. On the other hand, the power-on-reset signal must be held for a long enough time period for the power supply voltages to reach their proper levels, and for the digital circuitry to begin proper operation. This generally has been done by using RC circuits with large time constants and, consequently, large capacitance values.

A reset circuit is desirable which provides a reset signal having a normal duration in response to conditions during powered operations of the electronic system requiring the reset signal, but having a modified (e.g. extended) duration during power-on conditions. A reset circuit is further desirable which provides for optimized detection of transients, while providing a long enough power-on-reset signal, and which does not require a large number of components, which increases cost, and adversely affects reliability.

In accordance with principles of the present invention, a reset circuit in an electronic system includes a reset signal generator which generates a reset signal in response to predetermined conditions in the electronic system. A power-on detector is provided to cause the reset signal generator to modify the reset signal generated in response to a power-on situation.

DETAILED DESCRIPTION OF THE DRAWING

Figure 1:
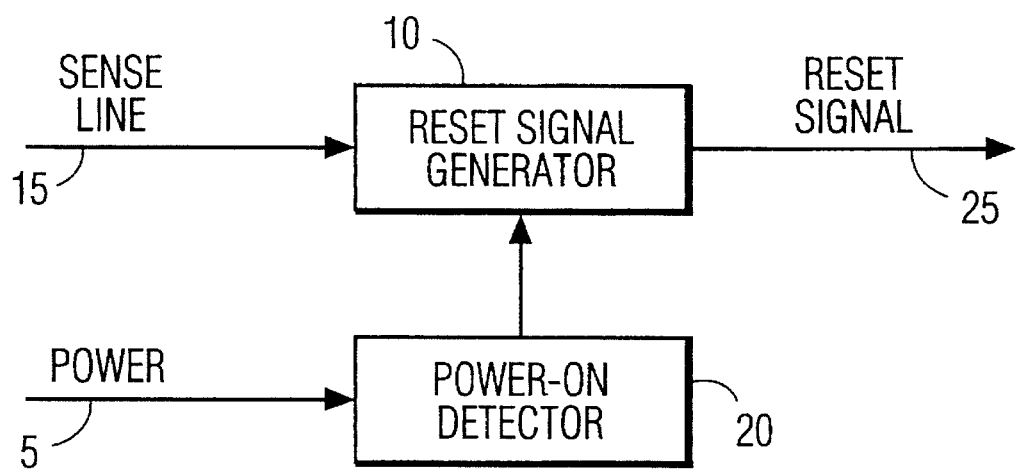
FIG. 1 is a block diagram of a reset signal generator in accordance with principles of the present invention.

The reset signal generator illustrated in FIG. 1 is embodied in an electronic system including digital circuitry (not shown). A sense line input terminal 15 is coupled to elements in the electronic system which produce signals indicating that a reset signal needs to be generated. For example, sense line input terminal 15 may be coupled to a signal in the electronic system line which would carry transient signals, or indicate the presence of a brown out. A reset signal generator 10 has a first input terminal coupled to the sense line input terminal 15, and an output terminal coupled to the reset signal output terminal 25.

A power supply input terminal 5 is coupled to a +5 volt power supply (not shown). The +5 volt power supply provides power to the electronic system. A power-on detector 20 has an input terminal coupled to the power supply input terminal 5, and an output terminal coupled to a second input terminal of reset signal generator 10.

In operation, reset signal generator 10 senses the signal on the sense line input terminal 15 to detect signal conditions indicating that a reset signal needs to be generated. For example, reset signal generator 10 may detect a transient on sense line input terminal 15, and generate a reset signal on reset signal output terminal 25. Alternatively, sense line input terminal 15 may be coupled to a power supply, and reset signal generator 10 may detect a brown out condition, and generate a reset signal on reset signal output terminal 25. Power-on detector 20 monitors the +5 volt power supply at input terminal 5 to determine whether power has just been applied (or reapplied) and, if so, generates a signal at its output terminal. In response to this signal, reset signal generator 10 generates a modified reset signal. For example, the duration of the reset signal may be lengthened in response to a power-on condition indicated by the power-on detector 20.

Figure 2:
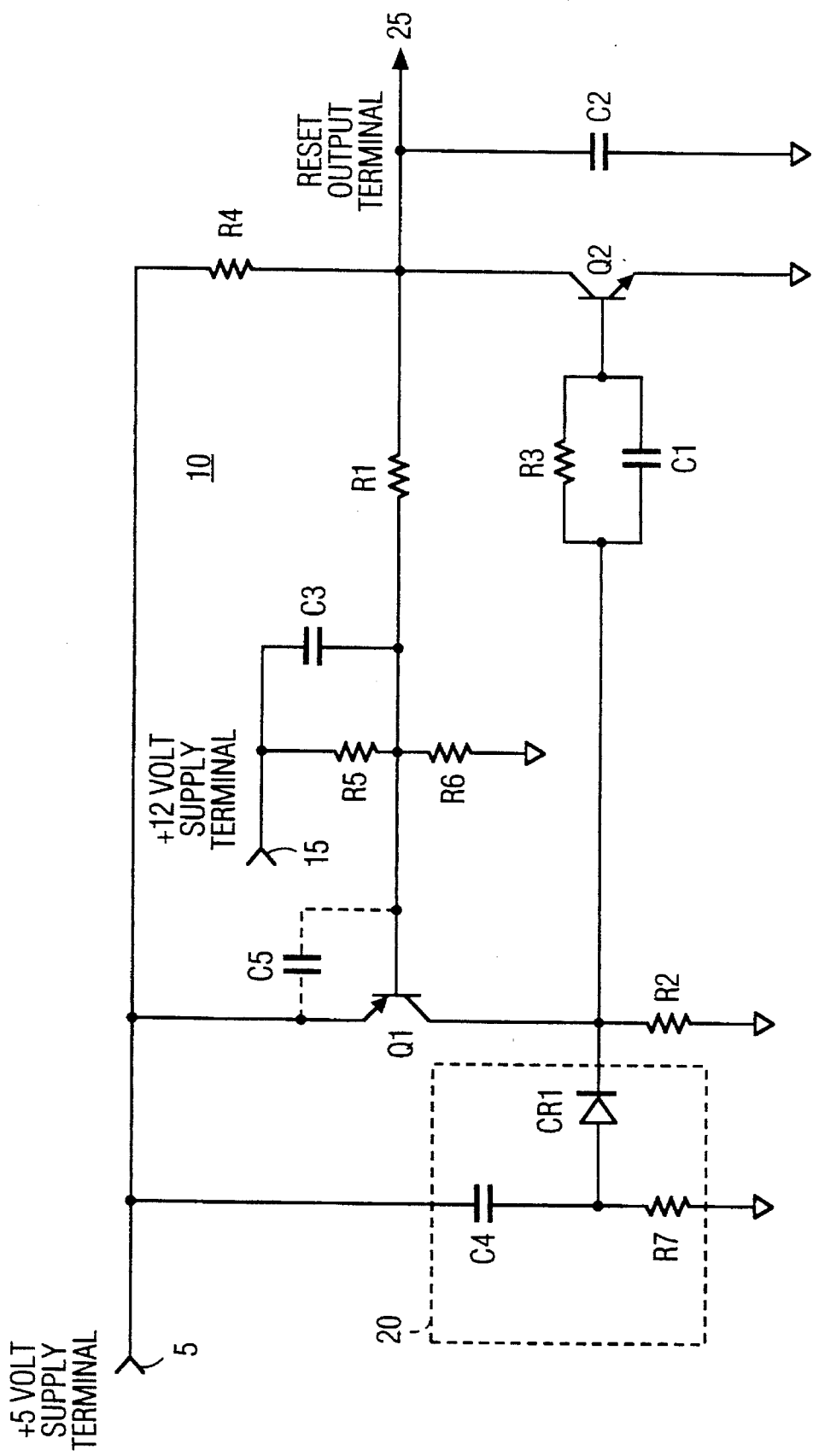
FIG. 2 is a schematic diagram showing the reset signal generator of FIG. 1 in more detail.

FIG. 2 is a schematic diagram showing the reset signal generator in more detail. In FIG. 2, elements similar to those illustrated in FIG. 1 are identified by the same reference numbers. In FIG. 2, power supply input terminal 5 is coupled to a +5 volt power supply and the sense line input terminal 15 is coupled to a +12 volt power supply. The voltage at the +5 volt supply terminal 5 is relatively stable with respect to brown out conditions and transients, compared to the voltage at the +12 volt supply terminal 15, for reasons described below. Therefore, the voltage on the +12 volt supply terminal is sensed to detect "brown out" (i.e., lower than normal voltage) conditions and transients. Reset signal output terminal 25 produces the reset signal for the digital circuitry in the electronic system. The reset signal produced at the reset output terminal 25 is a digital signal which is active low, meaning that the reset signal is represented by a reference voltage (ground) level signal, and under normal operating conditions, the signal maintains a +5 volt signal level.

The +5 volt supply terminal 5 is coupled to an emitter electrode of a PNP transistor Q1 and to a collector electrode of an NPN transistor Q2 through a resistor R4. The junction of resistor R4 and the collector electrode of NPN transistor Q2 is coupled to the reset output terminal 25. A base electrode of PNP transistor Q1 is coupled to the reset output terminal 25 through a resistor R1. A collector electrode of PNP transistor Q1 is coupled to the reference voltage terminal (ground) through a resistor R2, and to a base electrode of NPN transistor Q2 through the parallel connection of a resistor R3 and capacitor C1. An emitter electrode of NPN transistor Q2 is coupled to ground. A capacitor C2 is coupled between the reset output terminal 25 and ground.

The parallel connection of a resistor R5 and capacitor C3 is coupled between the +12 volt supply terminal 15 and the junction of the base electrode of PNP transistor Q1 and resistor R1, and a resistor R6 is coupled between the base electrode of PNP transistor Q1 and ground. The above mentioned elements, in combination, form the reset signal generator 10 illustrated in FIG. 1.

A serial connection of a capacitor C4 and a resistor R7 is coupled between the +5 volt supply terminal 5 and ground. The junction of capacitor C4 and resistor R7 is coupled to the anode electrode of a diode CR1. The cathode electrode of diode CR1 is coupled to the collector electrode of PNP transistor Q1. The combination of capacitor C4, resistor R7 and diode CR1 form power-on detector 10, illustrated in FIG. 1.

Figure 3:
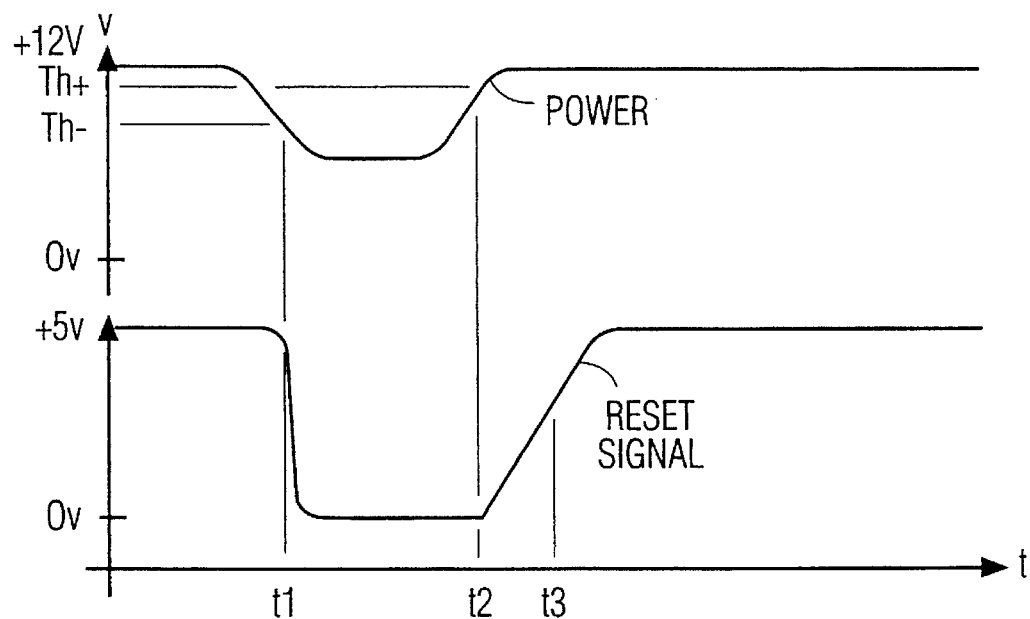
FIGS. 3 and 4 are waveform diagrams useful in understanding the operation of the reset signal generator illustrated in FIG. 2.

The operation of the reset signal generator illustrated in FIG. 2 may be better understood by reference to the waveform diagram illustrated in FIG. 3. In FIG. 3 the vertical axis is voltage and the horizontal axis is time. The uppermost waveform (POWER) represents the voltage at the +12 volt supply terminal 15, and the lowermost waveform (RESET SIGNAL) represents the voltage of the reset signal at the reset output terminal 25. In operation, in the quiescent state, all power supplies are stable and at their proper voltages, and all capacitors are charged and acting as open circuits. Resistors R5 and R6, form a voltage divider between the +12 volt supply terminal 15 and ground. The values of resistors R5 and R6 are selected to be 82 kilohms and 100 kilohms, respectively. This results in a voltage of about 6.6 volts at the junction of resistors R5 and R6, and, thus, at the base electrode of PNP transistor Q1. The emitter electrode of PNP transistor Q1 is coupled to the +5 volt supply terminal and the base-emitter junction of PNP transistor Q1 is, therefore, back biased, and PNP transistor Q1 is cutoff. No current flows through resistor R2, and the collector voltage of PNP transistor Q1 is pulled down to ground potential.

The base electrode of the NPN transistor Q2 is pulled down to ground potential through the serial connection of resistors R3 and R2. The emitter electrode of NPN transistor Q2 is also coupled to ground potential, and the base-emitter junction of NPN transistor Q2 is, therefore, off, and NPN transistor Q2 is cutoff. Resistors R4 and R1 form a voltage divider between the +5 volt supply terminal and the junction of resistors R5 and R6, which, as described above, is at a voltage of about 6.6 volts. For resistor values of 330 kilohms and 470 kilohms for resistors R4 and R1, respectively, the reset output terminal 25, is maintained at a voltage of about 5.6 volts in quiescent conditions.

Resistor R7 pulls the anode electrode of diode CR1 to ground potential and resistor R2 pulls the cathode electrode of diode CR1 to ground potential, and diode CR1 is, therefore, cutoff. Capacitor C4 is charged to 5 volts.

During a brown out condition, the voltage at the +12 volt supply terminal 15 begins to drop, as illustrated in FIG. 3. This voltage is divided down by resistors R5 and R6. At time t1, the voltage at the +12 volt supply terminal 15 drops below a threshold voltage Th-(representing a threshold for decreasing voltage), about 7.7 volts in the illustrated embodiment. The voltage at the junction of resistors R5 and R6 drops below 4.3 volts, the base-emitter voltage of PNP transistor Q1 becomes 0.7 volts, and PNP transistor Q1 begins to conduct. Resistor R2 then begins to conduct current, and the collector voltage of PNP transistor Q1 begins to rise from ground potential.

When the collector voltage of PNP transistor Q1 rises above +0.7 volts, the base-emitter junction of NPN transistor Q2 becomes forward biased. Resistor R3 and the base-emitter path of NPN transistor Q2 then begin to conduct. As NPN transistor Q2 begins to conduct, the collector voltage of NPN transistor Q2 begins to drop from 5.6 volts. This drop in the collector voltage of the NPN transistor Q2 draws current through resistor R1, which causes the voltage-at the base electrode of PNP transistor Q1 to drop even more, completing the operation of a positive feed back loop to rapidly and thoroughly saturate transistors Q1 and Q2. The combination of PNP transistor Q1 and NPN transistor Q2, thus, acts as a Schmitt trigger having an input terminal at the base electrode of PNP transistor Q1.

When NPN transistor Q2 is saturated, capacitor C2 is discharged and the voltage at the reset output terminal 25 is pulled down to ground potential, which is the voltage level of the reset signal for the digital circuitry in the electronic system. This is illustrated in FIG. 3 by the rapid drop of the voltage of the RESET SIGNAL from +5 volts to 0 volts at time t1. Resistor R1 is essentially coupled to ground potential through the collector-emitter path of NPN transistor Q2. This causes a voltage divider to be formed by resistors R5, R6 and R1, which divides the voltage at the +12 volt supply terminal about in half, which at the point of detecting a brown out condition is about 3.8 volts. Thus, a low level reset signal is developed for as long as the brown out condition continues.

When PNP transistor Q1 is saturated, its collector voltage, and consequently the voltage on the cathode of diode CR1, is pulled up to 5 volts. Capacitor C4, already charged to 5 volts in quiescent state (as described above), maintains the anode electrode of diode CR1 at ground potential. Thus, diode CRl is back-biased, and remains off, electrically isolating resistor R7 and capacitor C4 from the remainder of the reset circuit.

As the power brown out disappears, the voltage at the +12 volt supply terminal 15 begins to rise, as also illustrated in FIG. 3. As described above, the voltage divider formed by resistors R5, R6 and R1 divides the voltage at the +12 volt supply terminal 15 about in half. When the voltage at the +12 volt supply terminal 15 rises above a second threshold voltage Th+ (representing a threshold for a rising voltage), about 8.6 volts in the illustrated embodiment, the voltage at the base electrode of PNP transistor Q1 rises above 4.3 volts, causing the base-emitter voltage of PNP transistor Q1 to drop below 0.7 volts, and conduction through PNP transistor Q1 begins to decrease.

This causes the collector voltage of PNP transistor Q1 to begin to drop toward ground potential. When this happens, the current flowing through resistor R3 decreases and the base voltage of NPN transistor Q2 drops below 0.7 volts.

NPN transistor Q2 then stops conducting. The Schmitt trigger action described above, supplied by the positive feedback, rapidly drives PNP transistor Q1 and NPN transistor Q2 thoroughly into cutoff. This occurs at time t2 in FIG. 3. The Schmitt trigger also exhibits hysteresis at the switching point in the following manner. Once a brown-out is detected at 7.7 volts and a reset signal is generated, the supply voltage at terminal 15 must rise above about 8.6 volts in order to clear (i.e., remove) the reset signal.

Capacitor C2, which had been previously discharged through the collector-emitter path of NPN transistor Q2, begins to recharge primarily through resistors R1 and R4, and the reset signal voltage begins to rise from 0 volts, as illustrated in FIG. 3. At time t3, the reset signal rises above the logic threshold value and the digital circuitry in the electronic system begins its operation. The values selected for resistors R1 and R4 and capacitor C2 determine the width of the reset pulse generated under powered operations (e.g. in response to brown out conditions). A combination of resistor values for resistors R1 and R4 of 470 kilohms and 330 kilohms, respectively, and capacitor value for capacitor C2 of 0.01 µf results in a reset pulse width (from time t2 to time t3) of about 400 µsec after the brownout condition disappears.

Reset pulses are generated in response to transients in the same manner. One source of transients is arcing in high voltage components in the electronic system. For example, in a television receiver, the kinescope requires an anode voltage of roughly 30,000 volts, and arcing frequently occurs. This arcing causes a high voltage, high frequency, short duration ringing to occur on the +12 volt voltage supply.

In FIG. 2, capacitor C3, having a capacitive value of 220 pf, acts as an AC coupling capacitor to transfer any AC component on the +12 volt supply terminal directly to the base electrode of PNP transistor Q1, bypassing the voltage divider resistors R5 and R6. Any portion of the ringing transient signal which causes the base voltage of PNP transistor Q1 to drop below 4.3 volts will cause the Schmitt trigger formed by PNP transistor Q1 and NPN transistor Q2 to trigger as described above. This will discharge capacitor C2, generating the reset signal for the digital circuitry in the electronic system, as illustrated in the bottommost waveform in FIG. 3.

When the voltage of the transient signal rises above about 8.6 volts, the Schmitt trigger will reset, as described above, and capacitor C2 will begin to recharge. However, the recharge time of capacitor C2 is substantially longer than the duration of the transient signal, and the high frequency ringing transient signal will repeatedly trigger the Schmitt trigger, repeatedly discharging capacitor C2 for as long as the transient signal lasts. Only after the transient signal has dissipated, and capacitor C2 has recharged through resistors R1 and R4 will the reset signal be terminated and the operation of the digital circuitry resume.

As described above, the reset circuit illustrated in FIG. 2 triggers whenever the transient signal causes the base voltage of PNP transistor Q1 to drop below about 4.3 volts. Because the quiescent voltage at the base electrode of PNP transistor Q1 (established by the voltage divider formed by resistors R5 and R6) is 6.6 volts, any transient having a negative peak voltage below about 2.3 volts will trigger the reset circuit, not considering any impedance mismatch between the input impedance of the reset signal generator 10 and the transient signal source. One skilled in the art will understand that the actual trigger voltage will vary depending upon the relative output and input impedances of the transient signal source and reset signal generator.

The transient signal negative peak voltage level which will trigger the reset circuit may be adjusted by optionally including another capacitor C5, illustrated in phantom in FIG. 2. Capacitors C3 and C5, in combination, form a capacitive AC voltage divider across the base-emitter junction of PNP transistor Q1. The values of capacitors C3 and C5 may be selected to trigger the reset circuit and provide a reset signal in response to a transient signal having any desired negative peak voltage.

The operation of the reset circuit illustrated in FIG. 2 is different in response to a power-on condition. Under these conditions, some digital circuitry, such as microprocessors, require that the power supplies be stable for a specified period of time before the power-on reset signal is removed. For example, the ST 9294 microprocessor, manufactured by SGS/Thomson MicroElectronics, requires that the power supplies be stable for at least 20 ms (milliseconds) before the power-on reset signal is removed, in order to ensure proper operation.

Figure 4:
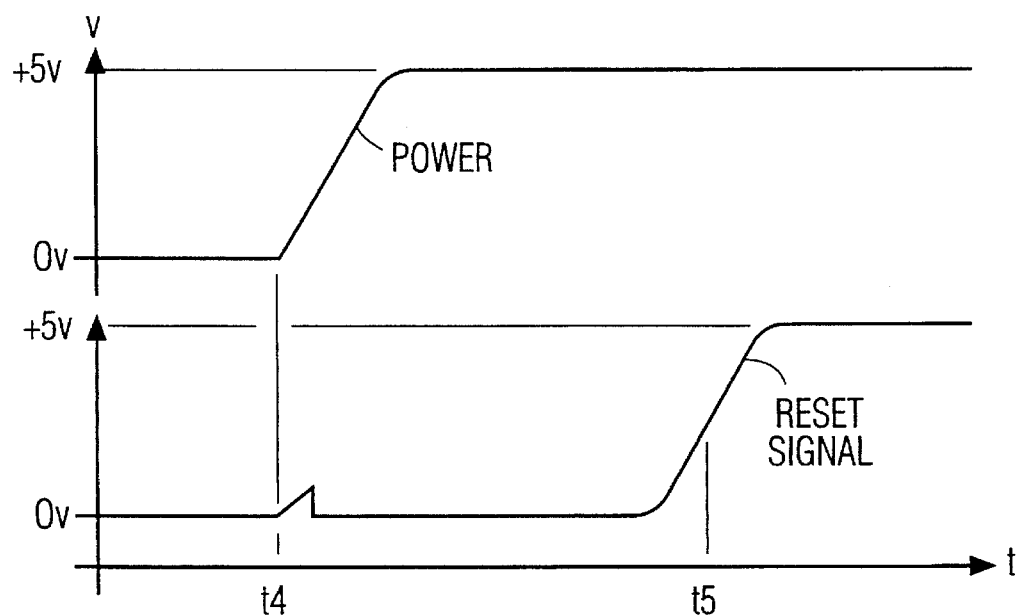

The operation of the reset circuit illustrated in FIG. 2 in response to a power-on condition may be better understood by reference to the waveform diagram illustrated in FIG. 4. In FIG. 4, the vertical axis represents voltage and the horizontal axis represents time. The uppermost waveform in FIG. 4 represents the voltage at the +5 volt supply terminal 5, and the lowermost waveform represents the voltage at the reset output terminal 25.

Under power off conditions, of course, all power supplies are off, and all capacitors are discharged and act as short circuits. When power is applied, at time t4 of FIG. 4, current is supplied to capacitor C2 through resistor R4. Capacitor C2 begins to charge, as illustrated by a rise in voltage just after time t4 in FIG. 4.

Timing capacitor C4 is discharged, and the anode of diode CR1 is pulled up to the +5 volt supply terminal voltage. Because the anode of diode CR1 is at +5 volts, diode CR1 turns on. This applies 5 volts to the base electrode of NPN transistor Q2 through the parallel connection of resistor R3 and capacitor C1. This causes NPN transistor Q2 to conduct, causing the Schmitt trigger formed by PNP transistor Q1 and NPN transistor Q2 to trigger. When NPN transistor Q2 becomes saturated, as described above, capacitor C2 is discharged and remains discharged generating the reset signal at reset signal output terminal 25. This is illustrated in FIG. 4 by the drop of the reset signal to 0 volts after time t4. The Schmitt trigger formed by PNP transistor Q1 and NPN transistor Q2, thus, has a second input terminal at the collector electrode of PNP transistor Q1. Resistors R2, R3 and R7 have respective values of 470 kilohms, 10 kilohms and 100 kilohms. Thus, timing capacitor C4 charges primarily through resistor R3 and the emitter-base path of NPN transistor Q2 (as well as through resistors R2 and R7).

As timing capacitor C4 charges, the voltage across resistors R2 and R7 drops toward ground, and the base voltage of NPN transistor Q2 drops accordingly. When the base voltage of NPN transistor Q2 drops below 0.7 volts, NPN transistor Q2 stops conducting, and the Schmitt trigger formed by PNP transistor Q1 and NPN transistor Q2 resets to its quiescent state, as described above. The reset signal ends when capacitor C2 charges to the logic threshold value, illustrated in FIG. 4 as time t5, as described above. The duration of the reset signal from the application of power (time t4 to time t5) is specified as 20 ms. The values selected for timing capacitor C4 (0.22 µf) and resistor R3 (10 kilohms) provide this time delay. Resistor R7 acts as a bleeder resistor to discharge timing capacitor C4 when power is removed from the reset circuit.

During powered operation, when the power supplies are stable and at their proper levels, the relatively large capacitance (timing capacitor C4), necessary to provide the extended reset signal at power-on, is isolated from the remainder of the circuit by diode CR1 so that the high voltage, high frequency, short duration transients are readily detectable, and a reset signal is generated in response. The reset circuit consists of just a few discrete components, with only three extra components (resistor R7, capacitor C4 and diode CR1) necessary to provide the extended power-on reset signal while remaining isolated from the remainder of the circuit during normal operations.

What is claimed is:

1. A reset signal generator comprising:

means, responsive to a signal indicating that a reset signal is necessary, for generating a reset signal having a first duration; and means, coupled to said generating means, and responsive to a power supply signal indicative of an initial application of power, for extending said duration of said generated reset signal from said first duration to a second duration longer than said first duration.

2. The reset signal generator of claim 1, wherein said extending means comprises means for isolating said extending means from said generating means during said normal operation following said initial application of power.

3. The reset signal generator of claim 2 wherein said extending means comprises a timing capacitor, coupled to receive said power supply signal; and said isolating means comprises a diode, coupled between said timing capacitor and said generating means, and means for backbiasing said diode during said normal operation following said initial application of power.

4. The reset signal generator of claim 1, wherein said generating means comprises means for detecting transient signals, and in response to said transient signals said generating means generates said reset signal having said first duration.

5. The reset signal generator of claim 1, wherein said generating means comprises means for detecting brown out conditions, and in response to said brown out conditions said generating means generates said reset signal having said first duration.

6. The reset signal generator of claim 5, wherein said generating means comprises means for detecting transient signals, and in response to said transient signals said generating means generates said reset signal having said first duration.

7. The reset signal generator of claim 6, wherein said generating means comprises a Schmitt trigger having an input terminal coupled to said brown out condition detecting means and said transient signal detecting means.

8. The reset signal generator of claim 7, wherein:

said indicating signal is a power supply signal;

said brown out condition detecting means comprises a voltage divider, coupled to receive said power supply signal, and coupled to said input terminal of said Schmitt trigger; and said transient detecting mean comprises an AC bypass capacitor for AC coupling said indicating signal to said input terminal of said Schmitt trigger.

9. The reset signal generator of claim 8, wherein said Schmitt trigger comprises a second input terminal coupled to said extending means.

10. The reset signal generator of claim 9, wherein said extending means comprises:

means for isolating said extending means from said generating means after said initial application of power; and means for extending said duration of said reset signal in response to said initial application of power.

11. The reset signal generator of claim 10, wherein:

said extending means comprises a timing capacitor, coupled to receive said power supply signal; and said isolating means comprises a diode, coupled between said timing capacitor and said generating means, and means for backbiasing said diode during said normal operation following said initial application of power.

12. A reset circuit, comprising:

means for generating a reset signal, said reset signal having a first duration in response to a first signal and a second duration in response to one of a second signal and a third signal;

means for generating said first signal in response to a detection of an initial development of power supply voltage;

means for receiving said power supply voltage, and for generating said second signal in response to a detection of a condition in which said power supply voltage is lower than a predetermined level; and means for generating said third signal in response to the detection of an unwanted transient signal having a predetermined characteristic.

13. A reset circuit, comprising:

means for generating a reset signal, said reset signal having a first duration in response to a detection of an initial development of power supply voltage and a second duration in response to one of a detection of a condition in which said power supply voltage is lower than a predetermined level and a detection of an unwanted transient signal having a predetermined characteristic;

means, coupled to said generating means, for detecting said initial development of power supply voltage;

means, coupled to said generating means, for receiving said power supply voltage, and for detecting said condition in which said power supply voltage is lower than a predetermined level; and means for detecting said unwanted transient signal having a predetermined characteristic.

14. A method of generating a reset signal, comprising the steps of:

detecting an initial development of power supply voltage;

detecting a condition in which said power supply voltage is lower than a predetermined level;

detecting an unwanted transient signal having a predetermined characteristic; and generating said reset signal, said reset signal having a first duration in response to said detection of said initial development of power supply voltage and a second duration in response to one of said detection of said condition in which said power supply voltage is lower than said predetermined level and said detection of said unwanted transient signal having said predetermined characteristic.

15. A method of generating a reset signal, comprising the steps of:

generating a first signal in response to a detection of an initial development of power supply voltage;

generating a second signal in response to a detection of a condition in which said power supply voltage is lower than a predetermined level;

generating a third signal in response to the detection of an unwanted transient signal having a predetermined characteristic; and generating said reset signal in response to one of said first second and third signals, said reset signal having a first duration in response to said first signal and a second duration in response to one of said second signal and said third signal.

* * * * *